US009129424B2

(12) United States Patent
Xue et al.

(10) Patent No.: US 9,129,424 B2
(45) Date of Patent: Sep. 8, 2015

(54) PHASE SENSITIVE T1 MAPPING IN MAGNETIC RESONANCE IMAGING

(71) Applicants: Hui Xue, Franklin Park, NJ (US); Peter Kellman, Bethesda, MD (US); Andreas Greiser, Erlangen (DE)

(72) Inventors: Hui Xue, Franklin Park, NJ (US); Peter Kellman, Bethesda, MD (US); Andreas Greiser, Erlangen (DE)

(73) Assignees: Siemens Aktiengesellschaft, Munich (DE); The United States of America, Washington, DC (US)

( * ) Notice: Subject to any disclaimer, the term of this patent is extended or adjusted under 35 U.S.C. 154(b) by 205 days.

(21) Appl. No.: 13/864,716

(22) Filed: Apr. 17, 2013

(65) Prior Publication Data

US 2013/0272591 A1 Oct. 17, 2013

Related U.S. Application Data

(60) Provisional application No. 61/625,254, filed on Apr. 17, 2012.

(51) Int. Cl.
*G06K 9/00* (2006.01)
*G06T 11/00* (2006.01)
*G01R 33/50* (2006.01)
*G01R 33/565* (2006.01)

(52) U.S. Cl.
CPC .............. *G06T 11/003* (2013.01); *G01R 33/50* (2013.01); *G01R 33/56509* (2013.01)

(58) Field of Classification Search
None
See application file for complete search history.

(56) References Cited

U.S. PATENT DOCUMENTS

2006/0161060 A1* 7/2006 Pai ................................ 600/431
2008/0119721 A1* 5/2008 Kimura et al. ................ 600/410
2010/0166667 A1* 7/2010 Jynge et al. .................. 424/9.36

OTHER PUBLICATIONS

D. R. Messroghli et al., "Modified Look-Locker Inversion Recovery (MOLLI) for High-Resolution T1 Mapping of The Heart," Magnetic Resonance in Meedicine, 52(1), pp. 141-146, 2004.
D. R. Messroghli et al., "Human Myocardium: Single-Breath-hold MR T1 Mapping with High Spatial Resolution—Reproducibility Study 1," Radiology, 238(3), pp. 1004-1012, 2006.
V. Ferreira et al., "Quantification of Acute Myocardial Injury by ShMOLLI T1-Mapping, T2-Weighted and Late Gadolinium Imaging in Patients Presenting with Chest Pain, Positive Troponins and Non-Obstructive Coronary Arteries," Journal of Cardiovascular Magnetic Resonance, 13 (Suppl 1):P6, pp. 1-2, 2011.
S. Piechnik et al., "Shortened Modified Look-Locker Inversion Recovery (ShMOLLI) for Clinical Myocardial T1-Maping at 1.5 and 3 T within a 9 Heartbeat Breathhold," Journal of Cardiovascular Magnetic Resonance, 12(1), pp. 1-11, 2010.
R. Deichmann, "Fast High-Resolution T1 Mapping of the Human Brain," Magnetic Resonance in Medicine, 54(1), pp. 20-27, 2005.
G. E. Gold et al., "Musculoskeletal MRI at 3.0 T: Relaxation Times and Image Contrast," American Journal of Roentgenology, 183(2), pp. 343-351, 2004.
S. J. Flacke et al., "Measurement of the Gadopentetate Dimeglumine Partition Coefficient in Human Myocardium in Vivo: Normal Distribution and Elevation in Acute and Chronic Infarction 1," Radiology, 218(3), pp. 703-710, 2001.

(Continued)

*Primary Examiner* — Hadi Akhavannik

(57) ABSTRACT

Phase sensitive T1 mapping is provided in magnetic resonance (MR). The phase from samples of a modified Look-Locker inversion recovery sequence may be used to normalize contrast, allowing for accurate motion registration without extra information acquisition. The sign may be estimated, allowing T1 mapping with a single application of a non-linear fit.

20 Claims, 3 Drawing Sheets

(56) References Cited

OTHER PUBLICATIONS

M. Ugander et al., "Quantitative T1-maps delineate myocardium at risk as accurately as T2-maps-experimental validation with microspheres," Journal of Cardiovascular Magnetic Resonance, 13 (Suppl 1):062, pp. 1-2, 2011.

H. Xue et al., "Motion Correction for Myocardial T1 Mapping Using Image Registration with Synthetic Image Estimation," Magnetic Resonance in Medicine, 67, pp. 1644-1655, 2012.

M. Sass et al., "Error Analysis for Optimized Inversion Recovery Spin-Lattice Relaxation Measurements," Journal of Magnetic Resonance, 25(2), pp. 263-276, 1977.

S. Nekolla et al., "T1 Maps by K-Space Reduced Snapshot-FLASH MRI," Journal of Computer Assisted Tomography, 16(2), 1992 (abstract).

P. Kellman et al., "Phase-Sensitive Inversion Recovery for Detecting Myocardial Infarction Using Gadolinium-Delayed Hyperenhancement," Magnetic Resonance in Medicine, 47(2), pp. 372-383, 2002.

C. Chefd'hotel et al., "Flows of diffeomorphisms for multimodal image registration," In: Proceedings of IEEE International Symposium on Biomedical Imaging, pp. 753-756, 2002.

C. Guetter et al., "Efficient Symmetric and Inverse-Consistent Deformable Registration Through Interleaved Optimization," pp. 590-593, 2011.

J. A. Nelder et al., "A Simplex Method for Function Minimization," Computer Journal, 7(4), pp. 308-313, 1965.

D. W. Marquardt, "An Algorithm for Least-Squares Estimation of Nonlinear Parameters," Journal of the Society for Industrial and Applied Mathematics, 11(2), pp. 431-441, 1963.

L. R. Dice, "Measures of the Amount of Ecologic Association Between Species," Ecology, 26(3), pp. 297-302, 1945.

A. P. Zijdenbos et al., "Morphometric Analysis of White Matter Lesions in MR Images: Method and Validation," IEEE Transactions on Medical Imaging, 13(4), pp. 716-724, 1994 (abstract).

\* cited by examiner

PHASE SENSITIVE T1 MAPPING IN MAGNETIC RESONANCE IMAGING

RELATED APPLICATIONS

The present patent document claims the benefit of the filing date under 35 U.S.C. §119(e) of Provisional U.S. Patent Application Ser. No. 61/625,254, filed Apr. 17, 2012, which is hereby incorporated by reference.

BACKGROUND

The present embodiments relate to T1 mapping in magnetic resonance (MR) imaging.

Quantification of T1 relaxation characterizes myocardial tissue to assess both ischemic and non-ischemic cardiomyopathies. Prior to the administration of contrast, an elevated value of myocardial T1 is associated with edema, which may be related to the inflammatory response to myocardial injury. Following the administration of a T1-shortening contrast agent, a shortened T1 corresponding to increased contrast agent concentration is associated with fibrotic scar or diffuse fibrosis, which has a greater extracellular volume than normal. Quantification of this extracellular volume fraction based on measurement of pre- and post-contrast T1-maps may be used to detect diffuse fibrosis, which is difficult to detect based solely on late enhancement imaging.

T1 mapping of the heart is a challenge mainly due to cardiac and respiratory motion. The normal T1 value of the myocardium is approximately 950 ms at a field strength of 1.5T. This time is on the order of the cardiac cycle, so cardiac motion is a problem. A modified Look-Locker Inversion Recovery (MOLLI) sequence may be used for myocardial T1 mapping. The pulse sequence for measuring inversion recovery is ECG triggered and acquires data at end-diastole when the heart is reasonably stationary. Unlike the standard Look-Locker (LL) T1 mapping that samples the recovery curve with single shot images in constant intervals after an initial preparation or inversion pulse, the MOLLI sequence typically splits the sampling of recovery curve across multiple heart-beats. To obtain sufficient samples for accurate T1 estimation at the desired inversion times (TI), multiple inversions and corresponding TI samples are used. The samples are acquired at the same end-diastolic phase, such as acquiring 6 to 11 inversion recovery (IR) samples at different TI times during a breath-hold.

MOLLI is still subject to motion artifacts. The heart may alter position over time or multiple cycles, not just during a cycle. The location of the heart may be different for end-diastole of one cycle than for another. In one approach to dealing with such motion, motion-free synthetic images presenting similar contrast to original MOLLI data are estimated. These synthetic images are registered to original MOLLI images to overcome the difficulties of largely varying contrast. However, the synthesis is a time consuming process and prone to error due to a low contrast-to-noise ratio around the zero crossing point. Coupled with time consuming iteration for T1 mapping, an undesired delay may occur.

BRIEF SUMMARY

By way of introduction, the preferred embodiments described below include methods, systems, and computer readable storage media for phase sensitive T1 mapping in magnetic resonance (MR). Using phase information, synthesis may be avoided. The phase from samples of the MOLLI sequence may be used to normalize contrast, allowing for accurate motion registration without extra information acquisition. The sign may be estimated, allowing T1 mapping with a single application of a non-linear fit.

In a first aspect, a method is provided for magnetic resonance T1 mapping based on motion correction and parametric fitting. An MR scanner acquires first frames of data in a first sampling series during a first inversion recovery and acquires second frames of data in a second sampling series during a second inversion recovery. A processor determines motion between a longest inversion time one of the first frames and a longest inversion time one the second frames, motion corrects the first frames as a function of the motion, changes phase of the motion corrected first frames of data and of the second frames of data where an amount of the changing being by a phase of a longest of the longest inversion time ones of the first and second frames, calculates polarities for the first and second frames as a first sign of a real part after changing the phase, multiplies a magnitude of the first and second frames by the respective polarity, registers the first and second frames using results from the multiplying, deforms at least some of the first and second frames as a function of the registering, estimates a second sign for each of the deformed first and second frames, and computes a T1 map as a function of the second signs.

In a second aspect, a non-transitory computer readable storage medium has stored therein data representing instructions executable by a programmed processor for phase sensitive T1 mapping in magnetic resonance (MR). The storage medium includes instructions for scanning with a modified Look-Locker inversion recovery sequence, recovering signs at different inversion recovery times of samples from the scanning, the signs being recovered as a function of phase, and mapping T1 as a function of the signs.

In a third aspect, a system is provided for phase sensitive T1 mapping in magnetic resonance (MR). A magnetic resonance (MR) scanner is configured to transmit a sequence of inversion pulses and scan a patient at multiple inversion times after each of the inversion pulses, the multiple inversion times triggered based on a heart cycle. A processor is configured to remove background phase from signals at each of the inversion times based on phase of signals at the longest inversion time, to estimate a polarity of signals at each of the inversion times from the signals after removal of the background phase, to motion correct the signals across the inversion times as a function of the polarity, and to map T1 from the motion corrected signals.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Phase sensitive T1 mapping with motion correction is used for cardiovascular magnetic resonance imaging. Motion correction is performed on an inversion recovery image series with significant contrast changes, such as T1 images acquired using the modified Look-Locker pulse inversion (MOLLI) sequence across multiple heart-beats.

The polarity of the MOLLI signal is restored using phase sensitive image reconstruction. For phase sensitive MOLLI motion correction, the background phases of the MOLLI signal may be estimated from the acquired MOLLI images with long TI associated with well recovered magnetization. This phase, from the images also used for T1 fitting, is utilized to restore the signal polarity for the entire MOLLI series. In this way, the varying image contrast during the MOLLI series may be removed, allowing for robust registration of MOLLI frames. Phase sensitive IR (PSIR) reconstruction leads to a monotonic relationship between the signal amplitude and the inversion recovery time (TI), thus facilitating image registration.

The T1 value of every pixel in the registered or motion corrected MOLLI images is estimated from the polarity restored MOLLI signals. The phase sensitive MOLLI mapping also leads to improved T1 map quality because the uncertainties of whether to invert points near the signal nulling are removed, effectively avoiding the need for determination of a $4^{th}$ fit parameter, the signal sign. This can result in SNR improvements of up to 40%.

Because the need to determine the signal inversion point is removed, the phase sensitive mapping may be on the order of 4 times faster than magnitude mapping and corresponding iterative fitting. The phase sensitive approach is fully automated and no manual interaction is required. Automation allows for inline myocardium T1 mapping. Improved T1 mapping may be provided for other applications (e.g., liver, brain, vessel wall or other non-cardiac applications) where the magnetization signal follows the inversion recovery.

Figure 1:
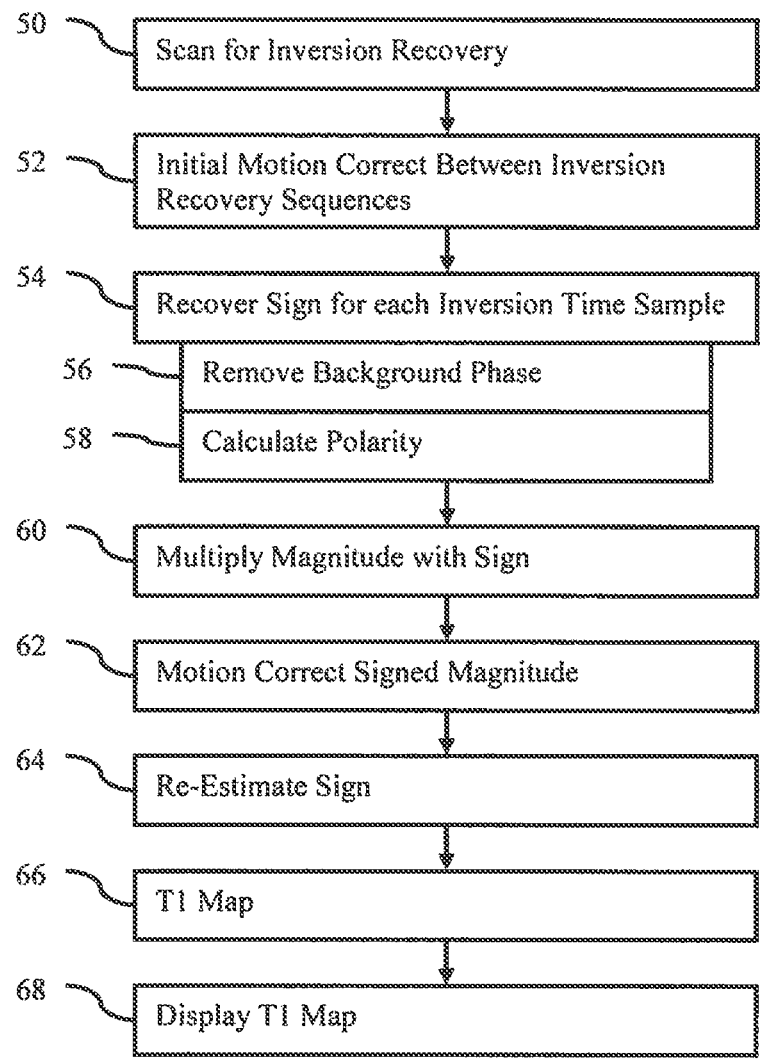
FIG. 1 is a flow chart diagram of an example embodiment of a method for phase sensitive T1 mapping with motion correction in magnetic resonance (MR)

FIG. 1 shows a method for motion correction in magnetic resonance (MR) T1 mapping. Phase sensitive reconstruction is used to correct contrast and map T1. The phase from a sample with long inversion timing is used to remove background from other samples, allowing recovery of polarity for the sequence of inversion recovery samples. The recovered polarity allows for registration with less influence from contrast variation and for more efficient T1 mapping.

Figure 2:
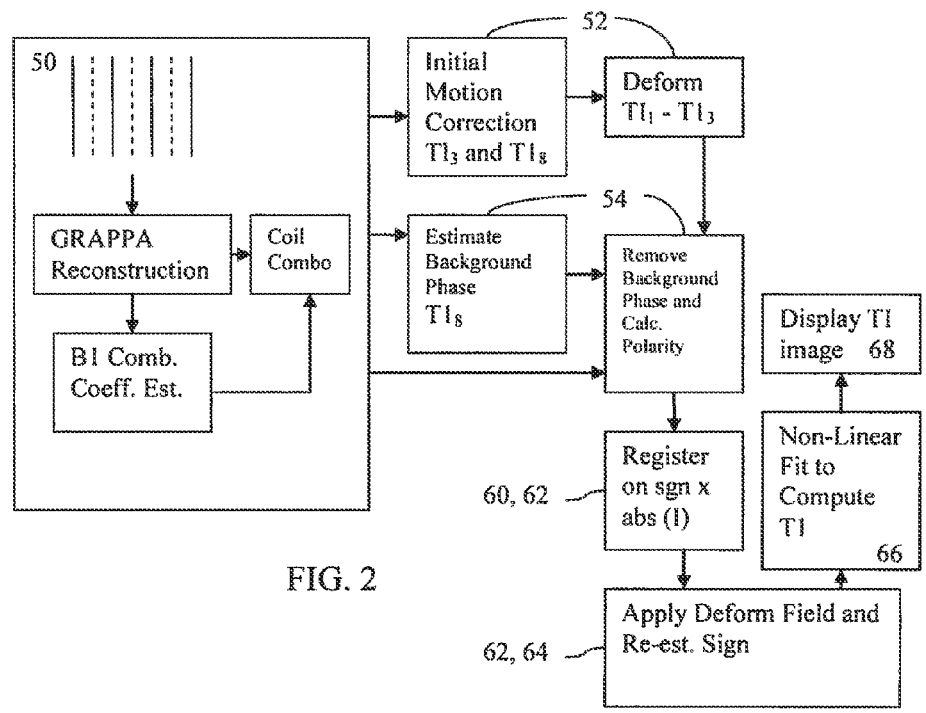
FIG. 2 is a flow chart diagram of another example embodiment of a method for phase sensitive T1 mapping with motion correction in magnetic resonance (MR)

FIG. 2 shows another embodiment of the method. FIG. 2 represents motion correction using phase sensitive reconstruction for T1 mapping given the scanning sequence represented in FIG. 3. Other sequences may be used, such as other image readout modules like spoiled gradient echo, echo planar or spin echo imaging. The method may be combined with various k-space trajectories like radial, spiral readout and reconstruction principles like parallal acquisition techniques and iterative reoconstruction methods, in combination with undersampled k-space acquisitions, to speed up the data acquisition.

Figure 4:
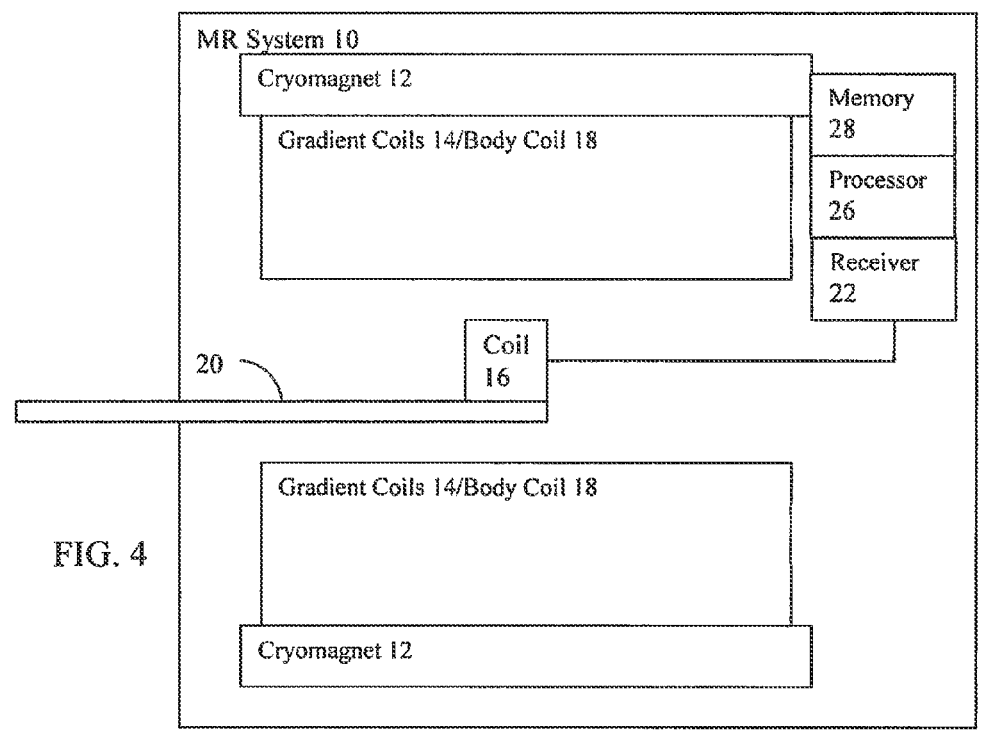
FIG. 4 is block diagram of one embodiment of a system for phase sensitive T1 mapping in magnetic resonance (MR).

The method of FIGS. 1 and/or 2 is performed by the MR system 10 of FIG. 4, a different system, a processor, or a computer. The scanning or sequence acquisition is performed with an MR scanner in real-time or by an MR scanner that stored the data in memory. A processor, such as a processor of a workstation associated with the MR scanner, a picture archiving and communications system (PACS), computer, or other image processing device, processes the samples and performs the T1 mapping.

The acts are performed in the order shown, but other orders may be provided. For example, the estimation of background phase and the initial registration may be performed in reverse order.

Additional, different, or fewer acts may be provided. For example, act 64 is not provided. As another example, the display act 68 is not performed. In yet another example, the removal of contrast variation is used for other processes in T1 mapping than motion correction. One or both of the motion correction acts 52 and/or 62 are not performed. In other embodiments, segmentation or other further use of the T1 map is provided. Acts associated with user input and/or sequencing of the MR scan may be provided.

In act 50, MR data is obtained. The MR data is obtained when the patient is scanned or obtained from memory where the patient was previously scanned.

A MR imaging system is used to scan within a patient. One or more transmitters produce an RF excitation field. A desired number of the transmitters are employed and connected through a corresponding number of transmit/receive switches to a corresponding number N of the coils in an RF coil array. The combined RF fields of the coil elements produce a prescribed $B_1$ field throughout the region of interest in the subject.

The signal produced by the subject in response to the RF excitation field is picked up by a coil array and applied to the inputs of the set of receive channels. The received signal is at or around the Larmor frequency. When the $B_1$ field is not being produced, the transmit/receive switches connect each of the receive channels to the respective coil elements. Signals produced by the excited spins in the subject are picked up and separately processed as k-space and/or object space data.

A scan sequence is performed to acquire the frames of MR data. The sequence is an inversion recovery scanning sequence. An inversion pulse is transmitted to flip the spin of the atoms relative to the main magnetic field. Additional scans are performed to map the recovery of the spins from the flipped condition to the stable condition caused by the main magnetic field. A series of frames of data representing the same region are acquired over time as the spin recovers. In one embodiment, a Look-Locker inversion recovery scan or a modified Look-Locker inversion recovery scan is performed.

Figure 3:
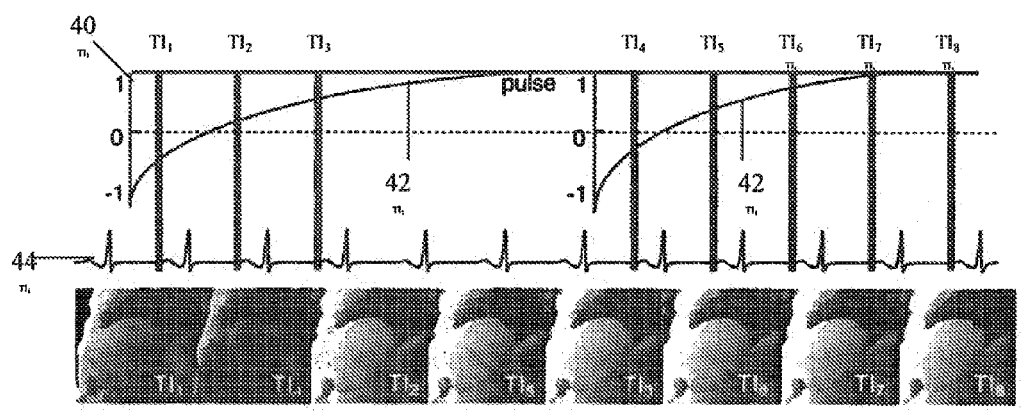
FIG. 3 is a graphical representation of modified Look-Locker pulse inversion sequence and corresponding inversion timing.

The sequence may be over one or more seconds, such as being over three to five seconds. The sequence may use multiple inversion pulses, so may be about or over ten to thirteen seconds. Longer or shorter sequences may be provided with different numbers of inversions, acquisition and recovery heartbeats. Also a short version with a single inversion may be used. In the example of FIG. 3, two inversion pulses are used. The inversion recovery scan sequence is repeated. Three or more inversion pulses may be used. Three samples or frames, $TI_{1-3}$, are acquired at different times during the first inversion recovery and five samples or frames, $TI_{4-8}$, are acquired at different times during the second inversion recovery. More samples may be acquired during the first inversion recovery than the second. A same number of frames may be acquired during both inversion recoveries.

The inversion times or sampling points for the frames are synchronized to the heart cycle 44. For a given inversion recovery, the samples are acquired at a same phase of the heart cycle. ECG triggering is used for the scanning. For example, the samples are acquired at end-diastole, but other phases may be used. Samples may be acquired at different phases for a same recovery in other embodiments. The samples occur at the same phase for both inversion recoveries in the example of FIG. 3, but a different phase may be used for the samples of the different inversion recoveries. A multi-phase version of the technique may be used in which images are acquired in a continuous fashion, enabling the acquisition of many images with different TIs within a single heartbeat. Other physiologic synchronization, like breathing belts for respiratory synchronization, may be used.

To better cover a range of possible T1 times, the phase for acquiring the samples and/or the phase for transmitting the inversion pulse 40 is shifted or different for the different inversion recoveries. In the example of FIG. 3, the second inversion pulse 44 occurs closer to end-diastole than the first inversion pulse 44.

To sample the inversion recovery, MR data is acquired. The MR data represents anatomy of a patient. The patient is positioned relative to the MR scanner and scanned. The MR data represents a slice or volume of the patient. In one embodiment, the MR data represents a slice or plane through a heart or other cardiac structure of a patient. The MR data is a set of pixels representing a plane. For a given time or time range, a frame of MR data is acquired. The frame represents different spatial locations at the given time. Other frames are provided for other times. The datum for each location in each frame is a sample. A series of frames provides a corresponding series of samples. In another embodiment, the MR data may also comprise a full 3D data set or multiple 2D slices that can be acquired in a sinlge shot or segmented acquisition, where only parts of the k-space are sampled within a given heartbeat and successive passes of the inversion recovery curves with the same TI times are used to fill up k-space. If the acquisition in a breathheld mode is not possible, the acquisition may also be combined with a respiratory navigator technique.

Each series of frames during the recovery provides a sampling of an MR intensity curve 42 of the tissue response over time to the inversion pulse 40. Due to the inversion pulse 40, the intensity curve 42 theoretically begins as negative values and exponentially recovers to positive values of magnetization. The horizontal axis represents time. The level of the dashed horizontal line along the vertical intensity axis represents a zero level of the intensity. In this implementation, negative values are not acquired. The scanning provides positive values, resulting in a mirror about the zero line of the negative part of the intensity curve 42 onto the positive. For T1 mapping, this zero crossing is identified so that the polarity may be reversed where appropriate. Using the phase sensitive processing, this zero crossing identification or associated iterations to determine which intensities are negative may be avoided.

The inversion curve 42 allows extraction of T1 information. The longitudinal relaxation from inversion of the proton magnetization is measured. The T1 is a rate constant for the relaxation or recovery.

The samples used for determining the curve 42 are from a same location (e.g., pixel) within the patient. Alternatively, the values from a plurality of locations in each frame are averaged and the average is used as the sample for that frame.

For a frame of data, samples representing different locations at a given sampling time are obtained. Where no motion occurs, the samples representing the same locations at each sampling period across frames may be used to extract the T1 information. Since motion occurs, the samples representing the same locations across frames are identified by motion correction.

The patient being scanned holds their breath during the sampling. In the example of FIG. 3, the patient holds their breath for eleven heart cycles (e.g., about 11 seconds). Longer breath holds may be used. Holding their breath may limit some motion between frames. In alternative embodiments, the patient is incapable of holding or does not hold their breath. Respiratory motion due to a failure of breath-holding or due to diaphragmatic drift could, if uncorrected, lead to errors in the pixel-wise estimation of TI and degrade final maps. Motion correction may be used in either breath holding or no breath holding. Respiratory motion correction may provide more accurate TI-mapping.

The breath hold may include a time period where no scanning occurs between inversion recovery sequences. FIG. 3 shows a three heart cycle period, but longer or shorter periods may be used. For example, scanning pauses for no, one, or at least two heart cycles during the breath hold. The scanning to sample may alter the steady state magnetization, so the pause period is provided so that the subsequent inversion recovery sequence is performed with an initial steady state more likely to be the same as the earlier inversion recovery sequence.

The scanning acquires k-space information. FIG. 3 shows the acquisition of k-space information. Further processing, such as Fourier analysis, converts the k-space information into object space information representing specific locations in the patient. For example, the frames of data used for motion correction and T1 mapping include data representing spatial locations in a plane of a patient.

Any reconstruction from k-space information may be used. For example, GRAPPA reconstruction (e.g., with an acceleration factor 2) is performed on the acquired k-space data. Phase-sensitive reconstruction is used for cardiac imaging.

Other processing may be performed, such as normalizing the B1 field. Where the k-space data is acquired from different coils (parallel imaging), the information from different coils is combined, providing frames of data representing the same locations at the same times. For example, phased array combination coefficients are estimated using a Rank-I Eigen-analysis. B1-weighed array combination is provided with noise pre-whitening.

The output of the scanning of act 50 is frames of object space or domain data. The frames represent samples for multiple locations at different sampling times. One frame is provided for each time.

The acquired k-space data and individual coil images are adaptively combined to produce a single complex image or frame of data for each inversion time. Each sample has real and imaginary components. The phase information is maintained in the reconstruction.

In act 52, motion occurring between the two or more inversion recovery sequences is corrected in an initial motion correction. The motion correction is not across all frames, but is between different inversion recovery sequences.

The unique challenge to register inversion recovery images acquired at different inversion times is due to the large variations in image contrast. Image registration is particularly difficult for images acquired close to the signal null-point (i.e., zero crossing). Different tissue species with differing values of T1, such as blood, fat, normal myocardium, edematous myocardium, and infarcted myocardium may experience signal nulling at different inversion times. Partial volume cancellation at the boundaries between pixels of different inversion recovery samples may occur when the two species are out-of-phase, which further confounds the image registration problem. At certain values of the inversion recovery time, there is little or no contrast between adjacent tissues, such as blood and myocardium. The change in contrast and appearance may be so significant that registration using either intensity or information-based metrics may experience problems. It is not practical to find a set of inversion recovery time values that avoid these problems due to the number of different expected values of T1.

A different, phase sensitive approach may be used rather than registration of the frames across all frames. While the phase is more spatially smooth, the initial misalignment between frames may still lower the accuracy of background phase removal. To correct this, an initial motion correction is applied.

Since some frames may be associated with contrast artifacts, the frames corresponding to the inversion times longest after the inversion pulse are used for an initial motion registration. In the example of FIG. 3, the frames $TI_3$ and $TI_8$ correspond to the longest inversion recovery sample times after the corresponding inversion pulse. The contrast is more likely consistent since these frames are more likely close to the steady state and further from the null point. Other frames may be used, such as the frames for the earliest inversion recovery sample time (e.g., $TI_1$ and $TI_4$).

The frames are registered. The registration aligns the data so that the same location or locations are represented despite the scans occurring at different times. The registration accounts for distortions caused by motion.

The data is registered to spatially align the frames of data from different scans. The translation, orientation, and/or scale resulting in a greatest similarity or correlation are found. Intensity or information-based metrics may be used for registration. Alternatively or additionally, the registration may rely on sensors. The sensors indicate the position of the patient relative to the MR scanner. In another approach, fiducials are used.

Data may be used for registration. The registration may be based on the data in general, such as the real part of the complex signal, the complex signal, or a magnitude. In other embodiments, the registration relies on segmentation of features and aligns based on the features. Features are detected. The features are mapped or labeled. The matching features from the different frames are determined, and a transformation relating the spatial positions is calculated. Other registration approaches may be used.

In one embodiment, the registration is a non-rigid registration. The relative spatial position of the locations represented by the data is not maintained, instead allowing for one or more degrees of freedom to warp the positions relative to each other to account for differences in spatial position. The registration may be rigid along one or more degrees of freedom. In one embodiment, the registration is non-rigid along two spatial and two rotational axes.

In one embodiment, elastic registration is used. The elastic registration algorithm may be based on the maximization of an intensity-based similarity metric. The metric may be selected from the group of local cross correlation and mutual information. The elastic registration algorithm may model the deformation as a smooth vector field. The deformation and its inverse may be estimated iteratively by maximizing an intensity-based similarity metric and are regularized using a low-pass filter.

The registration indicates a field of vectors corresponding to the shift of different locations between the two frames. This field of vectors is used for motion correction. The frames are altered based on the field of vectors. Interpolation, extrapolation, filtering, decimation, up-sampling, and/or other processes may be used to correct one frame relative to another. The deformation field is applied to motion correct.

One of the frames is used as a reference, such as the frame associated with the longest inversion recovery sample time (e.g., $TI_8$). The other frame (e.g., $TI_3$) is altered by the deformation field. The other frames in the same sampling series or inversion recovery sequence are also altered by the same deformation field (e.g., apply the deformation field to $TI_1$ and $TI_2$). Separate registration is not used for each combination of frames. The frames of one sequence are motion corrected according to the deformation between the frame with the longest inversion recovery sample time and the reference (e.g., longest inversion recovery sample time of the multiple sequences). The same deformation field is applied to the other images of the given inversion recovery sequence. This initial motion correction may lead to a reduction in phase error.

In act 54, the signs of the frames are recovered. Each frame corresponds to either a positive or negative magnetization depending on the inversion recovery time of the samples relative to the inversion recovery pulse and the tissue represented. The sign is the polarity or a binary representation of which side of the zero line is appropriate. A sign is determined for each of the samples for a given frame. The sign is a location-by-location value.

Phase is used to recover the sign. Phase sensitive image reconstruction provides for motion correction and T1 mapping. The varying image contrast during the series may be removed so that registering of the frames becomes more robust. Moreover, the inversion recovery fitting for T1 mapping on samples with restored polarity is more efficient and may lead to lower residual errors. Instead of using the phase information to only recover the sign of the signal, a full PSIR reconstruction of real-valued images, including complex phased array combining, may be applied to T1 mapping.

In FIG. 1, the signs are recovered by subtracting background phase in act 56 and calculating polarity in act 58. Additional, different, or fewer acts may be used.

In act 56, the background phase is utilized to restore the signal polarity of the samples. Thus, the difficulties of largely varying contrast are removed after phase sensitive image reconstruction and polarity detection. This approach utilizes the fact that the acquired frames with long inversion recovery time, T1, have well recovered magnetization. A phase for a location from the long inversion recovery time may be utilized to restore the signal polarity for the entire series of samples for that same location. Using phase from one of the frames also used for T1 mapping may avoid extra scanning. In another implementation, the reference phase image may also be acquired in a separate scan after or before the actual inversion recovery readout series for T1 fit. In the latter, the image may be acquired without any preceding inversion pulse, so more likely represents the fully relaxed positive longitudinal magnetization.

In the example of FIG. 3, the frame of data associated with the longest inversion recovery time is $TI_8$ (e.g., >3000 ms) Another frame not associated with the longest time, such as a second longest or longest from a particular inversion recovery sequence, may be used.

The phase varies spatially through the frame. Different samples for the different locations have different phase, as represented by the complex samples. To remove the background phase, the phase for a given location is subtracted from the phase for that same location in the other frames. The phase is removed on a pixel-by-pixel basis, but pixel grouping may be used. The field of phases from the background frame is subtracted from the corresponding phases in each of the other frames. This background removal occurs for each frame, including frames in other inversion recovery sequences. The subtraction changes the phasing for the samples of the frame. The amount of phase change for each location corresponds to the phase of the background frame for that location.

The background phase removal produces frames for which the signs of the real parts of the samples are the polarities of the inversion recovery signal. Because of the contaminated background phases, the real-parts of the reconstructed complex frames in general do not reflect the correction magnitude and polarity of inversion magnetization. The phase sensitive inversion recovery reconstruction allows preserving the polarity of magnetization while removing contaminating background phase errors.

In act 58, the polarity is calculated. The phase change may result in the real part changing from positive to negative or vise versa. Alternatively, the phase change may result in the real part staying negative or staying positive. The polarity is calculated as the sign of the real part after the change in phase or removal of the background phase. The positive or negative designation is calculated for each sample in each of the frames. The relationship of the sample relative to the zero crossing of the inversion recovery sequence is determined from the subtraction of phase from the more likely steady state magnetization of the frame with the longest inversion recovery sample time.

In act 60, the frames are prepared for frame-to-frame registration. To avoid possible phase errors due to imperfect registration, the real-part of the complex sample is not used for registration. In alternative embodiments, the real part is used.

The magnitude of the samples is calculated. The magnitude is the square root of the sum of the squares of the real and imaginary parts or other magnitude.

The magnitudes for the different samples in each frame are multiplied by the signs of the samples. The magnitude signal is multiplied by the restored polarity (e.g., sign) on a location-by-location basis for each frame. The resulting frames of data may have no or less contrast inversion between tissues.

In act 62, motion correction is performed. Given the frames with signal polarity restored, robust motion correction is achieved by registering the frames in a frame-by-frame manner, since the contrast inversion is removed. The frames are motion corrected on a frame-by-frame basis. Starting with any frame, such as a first or last acquired frame, temporally adjacent frames are registered and corrected to account for motion. Each subsequent registration and correction is between the next two temporally adjacent frames, such as $TI_2$ with $TI_1$, then $TI_3$ with the corrected $TI_2$, and so on. The motion correction occurs across the inversion recovery sequences, such as registering $TI_3$ with $TI_4$. Alternatively, the motion correction is between frames of each inversion recovery sequence but not across sequences. In another embodiment, two frames from different sequences are motion corrected relative to each other and then used as reference frames to motion correction within the respective sequences.

The motion correction uses the results of multiplying the magnitudes with the signs. The rigid or non-rigid spatial registration between frames from different times is performed with the signed magnitude values. Any of the registration techniques discussed above for act 52 may be used. The same or different registration is used for the two different motion correction acts 52 and 62.

In one embodiment, a fast variational non-rigid registration with a localized cross-correlation cost function is used because of the non-rigid nature of cardiac deformation. In this framework, a dense deformation field is estimated as the solution to a calculus of variation problem, which is solved by performing a compositional update step corresponding to a partial differential transport equation. The regularization is added by low-pass filtering the gradient images which are in turn used as a velocity field to drive the transport equation. To speed up the convergence and avoid local minima, a multi-scale image pyramid is created. The local cross correlation is used as the image similarity measure, as the local cross correlation's explicit derivative may be more efficiently calculated than mutual information and still be general enough to cope with noise and intensity difference between frames. Alternatively, a different optical flow registration method may be used.

The estimated deformations are used to warp the original complex frames. The frames output from the scanning are motion corrected. The deformation field is applied. The locations represented by the acquired samples are shifted so that the samples representing the same location are aligned throughout the series.

In act 64, a sign is estimated for the motion corrected frames of data. The sign is re-estimated once the frames are spatially aligned. The sign is re-estimated for each of the frames to be used for T1 mapping. The background phase is removed again. The background phase is from the motion corrected frame for the longest inversion recovery time or is the same background phase used in act 56. Other background phases may be used.

Once the background phase is removed from each frame, the sign is estimated. The polarity relative to the zero intensity of magnetization is determined from the complex signals. The real-part of the phase corrected samples is extracted for T1 fitting. The sign of the real-part after background phase removal provides the polarity.

In act 66, T1 mapping is performed on the signed, real-part of the complex samples. Due to the motion correction, the same tissue is likely represented across frames for a given location. The T1 map is generated via pixel-wise curve fitting.

Due to the maintenance of phase information, the sign is also likely correct. As a result, the intensity curve 42 is detectable. For computing the T1 map, the curve or characteristic of the curve is detected for different spatial locations. The inversion recovery is detected on a location-by-location basis. The rate constant T1 is determined from the fit curve. The T1 map indicates the curve at the scan time. A T1 map is created for each of the frames of data or scans.

The phase sensitive inversion recovery frames may not exhibit the contrast inversion appearing in magnitude images. In this way, the need for multiple fitting of the curve is eliminated and possible confusion of whether to invert data points near signal nulling is avoided. The sign is accurate so iterations of the curve fitting to find a fit associated with reversing some but not all of the polarities may be avoided. In alternative embodiments, iterative fitting is performed.

To detect the recovery curve, an exponential fit is made of the curve of the intensity or magnitude weighted by the sign. The non-linear least square fit is performed for each location across one of the sequences for inversion recovery. The fitting may be performed across another sequence as well, or the sequences may be temporally combined relative to the inversion pulses to fit a curve based on the samples from multiple inversion recoveries.

In one embodiment, the inversion recovery exponential curve is represented as $A-B\times\exp(-TI/T1^*)$ where $T1=T1^*\times(B/A-1)$. As a three parameter signal model: $S(x, y, t_n)=A(x, y)-B(x, y)-\exp(-t_n/T1^*(x, y))$, $T1(x, y)=T1^*(x, y)\times(B(x, y)/A(x, y)-1)$ where A, B and $T1^*$ are estimated by a three parameter nonlinear fit to the measured data after the polarity has been restored. t is the accumulative time from the inversion pulse, T1* is the apparent, modified T1 in an inversion recovery experiment. Other non-linear fitting for T1 mapping may be used.

Another approach to avoid multiple fittings may be to directly performing the fitting on the magnitude of the inversion recovery signal $|A(x,y)-B(x,y)\times \exp(-t)TI^*(x,y))|$ without trying to detect the polarity. Although this strategy may lead to reduced computational cost, the discontinuity of the signal derivative around the nulling point may degrade the fitting. For the post-contrast imaging with largely shortened T1 values, there may be an insufficient number of data points sampled before the signal nulling.

In one embodiment, a non-linear least square fit is performed only once for a spatial location associated with an inversion recovery. Compared to the magnitude based T1 mapping, the phase sensitive method has a higher computational efficiency. In order to detect the polarity of the magnitude signal, the curve fitting is performed multiple times until the residual errors are minimized. The initial fit assumes that all data points are positive, the second fit inverts the first data point, the third inverts the first two points, and so on. Moreover, with the correct signal polarity, residual errors may be lower for the phase sensitive fitting because uncertainties of whether to invert points near signal nulling are removed. An improved T1 map with less fitting errors may be provided.

In act 68, the T1 map is displayed as an image. A T1 map from one of the sampling times or a series of T1 maps is displayed. The image or images represent a two-dimensional slice, plane, or area within the patient. The images are of a standardized, arbitrary, scan, or other plane. The process may be repeated for pre and post contrast agents. Corresponding images are displayed for both simultaneously or sequentially for comparison.

Other processes may be performed and included in the image. For example, a measurement is made and displayed with the image. As another example, one more types of tissue are segmented or identified. A designator (e.g., outline, highlighting, brightness adjustment, different color, or other indication) is included on the image to distinguish the located tissue.

FIG. 4 shows a system 10 for phase sensitive T1 mapping in magnetic resonance (MR). The system 10 includes a cryomagnet 12, gradient coils 14, whole body coil 18, local coil 16, patient bed 20, MR receiver 22, processor 26, and memory 28. Additional, different, or fewer components may be provided. For example, another local coil or surface coil is provided. As another example, no local coils 16 are used.

Other parts of the MR system are provided within a same housing, within a same room (e.g., within the radio frequency cabin), within a same facility, or connected remotely. The other parts of the MR portion may include cooling systems, pulse generation systems, image processing systems, and user interface systems. Any now known or later developed MR imaging system may be used with the modifications discussed herein. The location of the different components of the MR system is within or outside the RF cabin, such as the image processing, tomography, power generation, and user interface components being outside the RF cabin. Power cables, cooling lines, and communication cables connect the pulse generation, magnet control, and detection systems within the RF cabin with the components outside the RF cabin through a filter plate.

The processor 26 and memory 28 are part of a medical imaging system, such as the MR system 10. In one embodiment, the processor 26 and memory 28 are part of the MR receiver 22. Alternatively, the processor 26 and memory 28 are part of an archival and/or image processing system, such as associated with a medical records database workstation or server. In other embodiments, the processor 26 and memory 28 are a personal computer, such as desktop or laptop, a workstation, a server, a network, or combinations thereof. The processor 26 and memory 28 may be provided without other components for implementing the method.

The magnetic resonance scanner includes the cyromagnet 12, gradient coils 14, body coil 18, and any local coils 16. The cryomagnet 12, gradient coils 14, and body coil 18 are in the RF cabin, such as a room isolated by a Faraday cage. A tubular or laterally open examination subject bore encloses a field of view. A more open arrangement may be provided. The patient bed 20 (e.g., a patient gurney or table) supports an examination subject such as, for example, a patient with a local coil arrangement, including the coil 16. The patient bed 20 may be moved into the examination subject bore in order to generate images of the patient. Any local coils 16 are placed on, under, against, or in the patient. Received signals may be transmitted by the local coil arrangement to the MR receiver 22 via, for example, coaxial cable or radio link (e.g., via antennas) for localization.

In order to examine the patient, different magnetic fields are temporally and spatially coordinated with one another for application to the patient. The cyromagnet 12 generates a strong static main magnetic field $B_0$ in the range of, for example, 0.2 Tesla to 3 Tesla or more. The main magnetic field $B_0$ is approximately homogeneous in the field of view.

The gradient coils 14 radiate magnetic gradient fields in the course of a measurement in order to produce selective layer excitation and for spatial encoding of the measurement signal. The gradient coils 14 are controlled by a gradient coil control unit that, like the pulse generation unit, is connected to the pulse sequence control unit.

The nuclear spins of atomic nuclei of the patient are excited via magnetic radio-frequency excitation pulses that are transmitted via a radio-frequency antenna, shown in FIG. 4 in simplified form as a whole body coil 18, and/or possibly a local coil arrangement (e.g., local coil 16). In the described embodiments, the method is applied to a water proton signal. The technique may also be applied to other body compartments like blood, fat and also to other MR-visible nuclei like 31P, 19F and 23Na. The body coil 18 is a single-part or includes multiple coils. Radio-frequency excitation pulses are generated, for example, by a pulse generation unit controlled by a pulse sequence control unit. After being amplified using a radio-frequency amplifier, the radio-frequency excitation pulses are routed to the body coil 18 and/or local coils 16. The signals are at a given frequency band. For example, the MR frequency for a 3 Tesla system is about 125 MHz+/− 500 KHz. Different center frequencies and/or bandwidths may be used.

Any pulse sequence may be used for scanning. In one embodiment, an inversion pulse is transmitted. After transmission, the patient is scanned to measure the inversion recovery or relaxation information. For example, the MR system 10 implements a Look-Locker sequence modified to scan based on ECG triggering and to use multiple inversion pulses and corresponding measures. The scanning occurs before adding contrast agent for a baseline measure and after or during adding of contrast agent. The scanning may be used just with contrast agent or only without contrast agent. Other sequences for T1-weighted measurement or T1 measurement may be used.

The signals emitted by the excited nuclear spins are received by the local coils 16 and/or the body coil 18. In the course of an MR measurement, the excited nuclei induce a voltage in the local coils 16. In some MR tomography procedures, images having a high signal-to-noise ratio (SNR) may be recorded using local coil arrangements (e.g., loops, local coils). The local coil arrangements (e.g., antenna systems) are disposed in the immediate vicinity of the examination subject on (anterior) or under (posterior) or in the patient. The received signals are amplified by associated radio-frequency preamplifiers and transmitted in analog or digitized form.

The MR receiver 22 connects with the coils 16. The connection is wired (e.g., coaxial cable) or wireless. The connection is for data from the coils 16 to be transmitted to and received by the MR receiver 22. The data is K-space data. In response to an MR pulse, the coils 16 receive the K-space data and transmit the data to the MR receiver 22. Any pulse sequence may be used. Any spatial resolution may be provided, such as a spatial resolution of 0.78 mm.

The signals are processed further and digitized by the MR receiver 22. The recorded measured data is stored in digitized form as complex numeric values in a k-space matrix. An associated MR image of the examination subject may be reconstructed using a one or multidimensional Fourier transform from the k-space matrix populated with values. Each MR image is a frame of complex or phase sensitive values.

The MR receiver 22 includes the processor 26 or another processor (e.g., digital signal processor, field programmable gate array, or application specific circuit for applying an inverse Fourier transform) for reconstructing the K-space data. The MR receiver 22 is configured by hardware or software to calculate data in the spatial domain from the K-space data. The processor 26 applies an inverse Fast Fourier transform to calculate the power spectrum of the projection data. The power spectrum provides intensity as a function of frequency. The frequency corresponds to space or distance. The MR data as acquired is a function of frequency and after applying inverse FT becomes a function of space. Any transform for reconstructing spatial data from the K-space data may be used.

The MR system 10 and MR scanner are configured by hardware and/or software to acquire frames of data. Scans are repeated to acquire frames of data representing the tissue response at different times relative to an inversion pulse. The series of scans may be repeated to obtain data sufficient to distinguish the likely T1 time given the scan sequence. T1-weighted information is acquired for different times in response to each inversion pulse.

The processor 26 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for phase sensitive inversion recovery processing. The processor 26 is a single device or multiple devices operating in serial, parallel, or separately. The processor 26 may be a main processor of a computer, such as a laptop or desktop computer, or may be a processor for handling some tasks in a larger system, such as being part of the MR receiver 22 or MR imaging system 10. The processor 26 is configured by instructions, design, hardware, and/or software to perform the acts discussed herein.

The processor 26 is configured to perform the method of FIG. 1, FIG. 2, or another method. The processor 26 performs the acts, controls other components (e.g., MR system 10) to perform the acts, and/or acquires data to perform the acts. For example, the processor 26 controls the MR system 10 to perform a series of inversion recovery scans. Scans for T1 mapping, such as a modified Look-Locker inversion recovery sequence using an ECG trigger, are performed in response to control by the processor 26. Alternatively, the processor 26 obtains the results of the scan without controlling the MR system 10 to perform the scan.

The processor 26 operates on complex information, such as complex signals in object space. The processor 26 performs various data processing on acquired k-space data and/or on reconstructed object space data (e.g., operates on object space data output by the MR receiver 22). For example, the processor 26 is configured to register signals from one inversion recovery sequence with signals from another inversion recovery sequence. The deformation field from the registration is applied to the signals of one of the inversion recovery sequences to more likely spatially align the two sequences.

The processor 26 is configured to remove background phase from signals at each of the inversion times, TI, based on the phase of signals at the longest inversion time (e.g., $TI_8$). The background phase from signals of one inversion recovery time is subtracted from the phase of signals for other inversion recovery times. The subtraction may or may not result in the real part of the complex signals changing sign. The polarity of the signals is estimated for each inversion time from the signals after removal of the background phase. The sign of the real part of the complex signal is used as the estimate. Contrast may be more uniform by removal of the background phase.

The processor 26 is configured to motion correct the signals across the inversion times as a function of the polarity. The magnitude, intensity, or other representation of the signals is used for motion correction. Since the magnitude is an absolute or positive value, the magnitude is multiplied by the sign. The polarity of the signals is added back. The registration is based on the signed magnitude signals. Deformation fields are determined and applied in a moving window to the signals of the various inversion recovery times. Alternatively, one set of signals from one inversion recovery time is used as a reference from which the deformation fields for other inversion recovery times are determined.

After motion correcting the signals of the different inversion recovery times, the processor 26 re-estimates the polarities. The background phase from the signals of the longest inversion recovery time or other inversion recovery time is removed across the spatially aligned signals for the other inversion recovery times. The sign of the real parts after the phase correction is determined as the estimate.

The processor 26 creates one or more T1 maps using the motion corrected signals. For example, the magnitudes of the motion corrected signals are determined. The re-estimated sign is added to the magnitudes for non-linear curve fitting. A least square, pattern match, or other fit of the signed magnitudes is performed. Only a single fit may be needed due to the maintenance of the phase or sign information. Alternatively, an iterative fitting is performed.

Any characteristic of the resulting curve is calculated for the T1 map. The characteristic may vary by inversion recovery time, such as a slope of the curve at the given time, so multiple T1 maps may be generated for each inversion recovery sequence. Alternatively, one T1 map is formed for each sequence. In another embodiment, the motion corrected and signed (re-estimated polarity) signals from multiple sequences are combined or used together to create one or more T1 maps.

The memory 28 is a graphics processing memory, video random access memory, random access memory, system memory, cache memory, hard drive, optical media, magnetic media, flash drive, buffer, database, combinations thereof, or other now known or later developed memory device for storing data or video information. The memory 28 is part of an imaging system, part of a computer associated with the processor 26, part of a database, part of another system, a picture archival memory, or a standalone device.

The memory 28 stores K-space data, reconstructed data in the spatial domain (e.g., complex signals in frames representing magnetic relaxation in a planar region of the patient at different times), T1 maps, coordinates, times, pulse sequences, registration information, signs, and/or other information used in image processing. As an alternative or in addition, the memory 28 stores protocols for scanning.

The memory 28 or other memory is alternatively or additionally a non-transitory computer readable storage medium storing data representing instructions executable by the programmed processor 26 for phase sensitive T1 mapping in magnetic resonance (MR). The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

A display may be provided for displaying an image or images. T1 maps are displayed. A sequence of T1 maps may be displayed. The raw image series from an inversion recovery may be displayed simultaneously. T1 maps and raw image series from before and after addition of contrast may be displayed in sequence or simultaneously. An image derived from a difference between T1 maps may be displayed. Numerical results for T1 may be derived and displayed, based on automatic segmentation of the T1 maps or raw image series.

The display is a monitor, LCD, projector, plasma display, CRT, printer, or other now known or later developed devise for outputting visual information. The display receives images, graphics, or other information from the processor 26 or memory 28.

In one embodiment, the object space data output by the MR receiver 22 is processed on a personal computer. The method is implemented in C++. Computations are performed on a dual-core desktop with 3.00 GHz cpu and 6 GB RAM. For the modified Look-Locker inversion recovery protocol of two inversion recovery experiments and 8 images (see the FIG. 3 example), the typical time cost for the phase sensitive motion correction is on the order of 2 seconds, and the time cost for phase sensitive T1 mapping is on the order of 2 seconds. As a result, the efficiency of the proposed phase sensitive motion correction in T1 mapping technique is well suited for the inline (e.g., real-time or during patient presence) T1 mapping scenario.

In an example, 17 patients (8 males, 45.8±18.2 yrs) undergo examinations using 1.5T scanners (MAGNETOM Avanto and Espree, Siemens AG Healthcare Sector, Erlangen, Germany). At least two slices (short axis and four chamber) are acquired for each subject both pre and post-contrast. Images at 8 TIs are acquired within a breath-hold: 3 after the first IR, 3 heart beats pause, and 5 after the second IR (see FIG. 3).

The imaging parameters are: SSFP, flip angle 350, FOV 360×270 $mm^2$, slice thickness 6 mm, minimum TI 120 ms, increment 80 ms, matrix 192×130, TR/TE 2.4/1.0 ms, and 7/8 partial Fourier plus parallel imaging factor 2 with temporal resolution 140 ms. A total of 63 modified Look-Locker inversion recovery series (34/29 pre/post-contrast, 36/27 short/long axis) are acquired. Other parameter values or settings may be used.

To quantify the accuracy of motion correction, two frames are selected by a human rater for every series. The myocardium is manually delineated on each selected image. The criteria of selection are a) myocardium shows discernible movement and b) myocardium bears enough contrast. For series where motion is visible, frames exhibiting movement are picked to highlight the improvement of correction. For series where myocardium is still, frames showing the best contrast are picked to minimize the errors of manual segmentation. After motion correction, the segmented myocardium is propagated to the corrected images using the deformation fields outputted by the image registration.

An ideal motion correction leads to a perfect overlap between segmented myocardium from two frames. Therefore, the overlap rate before and after motion correction is computed as the Dice similarity coefficient (DSC). For two segmented regions A and B, the DSC is defined as: DSC=2×area(A∩B)/(area(A)+area(B)). This value is 1 for a perfect overlap and 0 for non-overlap.

To further evaluate the performance of motion correction, the false positive (FP) and false negative (FN) errors are also computed. FP is defined as the percentage area of segmented myocardium in the first frame that is not labeled in the second, and FN is defined as the percentage area of myocardium in the second that is not labeled in the first.

Because the cardiac motion may be non-rigid in its nature, the myocardium boundary errors (MBE), which is defined as the mean distance between endo/epi contours of two frames, are computed for all series as well. While DSC captures the bulk motion due to failed breath-holding, MBE highlights the local myocardial deformation probably due to imperfect cardiac gating.

To verify the necessity of motion correction for inversion recovery images acquired across multiple heart-beats, visual reading is performed for all datasets, which are classified into two categories according to the presence of myocardium motion. In this example, noticeable motion is not found in 42 series (no motion, 66.7%) and is found in 21 series (with motion, 33.3%).

To reveal the inadequate robustness of directly registering images using a fixed reference (this strategy is referred as 'direct registration' hereafter), the fast variational non-rigid image registration algorithm is used. All frames within a series are registered to the 5th frame, which may exhibit the best contrast between the myocardium and blood. Although the first or last frames have higher SNR, there is insufficient contrast due to fully inversed or recovered magnetization. Due to the variation of T1 values among different tissues and subjects, it is difficult to select a frame consistently presenting good contrast between myocardium and blood-pool.

The direct registration with a fixed reference among images with largely varying contrast may lead to unrealistic deformation or failed registration. To measure the failure rate, visual reading is performed on all outputs of the direct registration strategy and unrealistic deformation is found, for example, in 39 cases among the whole cohort (62%). In many cases, even where the original myocardium is still, the significant contrast changes, especially around the epi-cardial fat region, may drive the registration in the wrong way.

On the contrary, the proposed phase sensitive approach may be robust for drastic contrast changes and not introduce unrealistic deformation in all test cases. Table 1 summarizes the quantitative results, showing significant improvements of motion correction measures ($P<0.05$ for all 4 statistics), where on is original and moco is phase sensitive motion correction. In this study, the phase sensitive T1 mapping is on the order of 4× faster than magnitude mapping (~2s vs. ~8s).

|  | Dice | | FP | | FN | | MBE[mm] | |
| --- | --- | --- | --- | --- | --- | --- | --- | --- |
|  | ori | moco | ori | moco | ori | moco | ori | moco |
| Mean | 0.85 | 0.90 | 0.15 | 0.12 | 0.15 | 0.09 | 1.46 | 0.92 |
| std | 0.05 | 0.02 | 0.06 | 0.05 | 0.07 | 0.04 | 0.05 | 0.02 |

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for magnetic resonance (MR) T1 mapping with motion correction and parametric fitting, the method comprising:
acquiring, with an MR scanner, first frames of data in a first sampling series during a first inversion recovery;
acquiring, with the MR scanner, second frames of data in a second sampling series during a second inversion recovery;
determining, with a processor, motion between a longest inversion time one of the first frames and a longest inversion time one the second frames;
motion correcting, with the processor, the first frames as a function of the motion;
changing, with the processor, phase of the motion corrected first frames of data and of the second frames of data, an amount of the changing being by a phase of a longest of the longest inversion time ones of the first and second frames;
calculating, with the processor, polarities for the first and second frames as a first sign of a real part after changing the phase;
multiplying, with the processor, a magnitude of the first and second frames by the respective polarity;
registering, with the processor, the first and second frames using results from the multiplying;
deforming, with the processor, at least some of the first and second frames as a function of the registering;
estimating, with the processor, a second sign for each of the deformed first and second frames; and
computing, with the processor, a T1 map as a function of the second signs.

2. The method of claim 1 wherein acquiring the first and second frames comprises acquiring the first and second frames as complex signals reconstructed from k-space information during a breath hold of a patient, the first frames acquired at a first phase of a first plurality of heart cycles and the second frames acquired at a second phase of a second plurality of heart cycles, the first plurality of heart cycles separated by the second plurality of heart cycles by at least two heart cycles.

3. The method of claim 1 wherein determining the motion comprises non-rigid registering, and wherein motion correcting comprises applying a deformation field of the non-rigid registering.

4. The method of claim 1 wherein changing the phase comprises removing background phase, the background phase being the phase of the longest of the longest inversion time ones of the first and second frames.

5. The method of claim 1 wherein calculating the polarities comprises determining a positive or negative designation for an inversion time of each first frame and each second frame.

6. The method of claim 1 wherein the first and second frames each represent multiple locations in a planar region, wherein changing the phase comprises changing the phase on a location-by-location basis, wherein multiplying the magnitude comprises multiplying the magnitude on the location-by-location basis, and wherein computing the T1 map comprises computing T1 on the location-by-location basis.

7. The method of claim 1 wherein registering comprises performing a fast variational non-rigid registration with a localized cross-correlation cost function.

8. The method of claim 1 wherein estimating the second sign and calculating the polarities comprise determining relative to a zero of the first and second inversion recoveries.

9. The method of claim 1 wherein computing the T1 map comprises performing a non-linear least square fit for each location across the first frames.

10. The method of claim 9 wherein the non-linear least square fit is performed only once for each location across the first frames.

11. The method of claim 1 further comprising:
displaying the T1 map as an image.

12. In a non-transitory computer readable storage medium having stored therein data representing instructions executable by a programmed processor for phase sensitive T1 mapping in magnetic resonance (MR), the storage medium comprising instructions for:
scanning with a modified Look-Locker inversion recovery sequence;
recovering signs at different inversion recovery times of samples from the scanning, the signs being recovered as a function of phase; and
mapping T1 as a function of the signs.

13. The non-transitory computer readable storage medium of claim 12 wherein scanning comprises acquiring data representing locations of a plane at sample times corresponding to a phase of a heart cycle in response to an inversion recovery.

14. The non-transitory computer readable storage medium of claim 12 wherein recovering the signs comprises removing background phase of the samples and estimating the signs of a real part of the samples after the removing of the background phase.

15. The non-transitory computer readable storage medium of claim 12 wherein the scanning is repeated;
further comprising:
first motion correcting between samples of the scanning and the scanning repetition associated with a longest inversion recovery time prior to recovering the signs;

multiplying magnitudes of the samples with the signs; and
second motion correcting between the magnitudes multiplied with the signs of the scanning and the scanning repetition for all of the inversion recovery times.

16. The non-transitory computer readable storage medium of claim 12 wherein recovering comprises recovering as a function of the phase from one of the samples where the one of the samples is also used for the mapping.

17. The non-transitory computer readable storage medium of claim 12 wherein mapping T1 comprises performing a non-linear least square fit only once for a spatial location associated with an inversion recovery due to the recovering.

18. A system for phase sensitive T1 mapping in magnetic resonance (MR), the system comprising:
a magnetic resonance (MR) scanner configured to transmit a sequence of inversion pulses and scan a patient at multiple inversion times after each of the inversion pulses, the multiple inversion times triggered based on a heart cycle; and
a processor configured to remove background phase from signals at each of the inversion times based on phase of signals at the longest inversion time, to estimate a polarity of signals at each of the inversion times from the signals after removal of the background phase, to motion correct the signals across the inversion times as a function of the polarity, and to map T1 from the motion corrected signals.

19. The system of claim 18 wherein the MR scanner is configured to perform a modified Look-Locker inversion recovery sequence for each of the transmits and the scans.

20. The system of claim 18 wherein the processor is configured to re-estimate the polarities from the motion corrected signals and to map the T1 with a single non-linear least square fit to the motion corrected signals based on the re-estimated polarities.

* * * * *